(12) United States Patent
Flaim et al.

(10) Patent No.: US 10,103,048 B2
(45) Date of Patent: Oct. 16, 2018

(54) DUAL-LAYER BONDING MATERIAL PROCESS FOR TEMPORARY BONDING OF MICROELECTRONIC SUBSTRATES TO CARRIER SUBSTRATES

(71) Applicant: Brewer Science Inc., Rolla, MO (US)

(72) Inventors: Tony D. Flaim, St. James, MO (US); Jeremy McCutcheon, Rolla, MO (US)

(73) Assignee: Brewer Science, Inc., Rolla, MO (US)

( * ) Notice: Subject to any disclaimer, the term of this patent is extended or adjusted under 35 U.S.C. 154(b) by 199 days.

(21) Appl. No.: 14/472,073

(22) Filed: Aug. 28, 2014

(65) Prior Publication Data

US 2015/0064385 A1  Mar. 5, 2015

Related U.S. Application Data

(60) Provisional application No. 61/871,158, filed on Aug. 28, 2013.

(51) Int. Cl.
*B32B 38/10* (2006.01)
*H01L 21/683* (2006.01)
(Continued)

(52) U.S. Cl.
CPC .......... *H01L 21/6835* (2013.01); *B32B 37/14* (2013.01); *B32B 37/30* (2013.01); *B32B 43/006* (2013.01); *B32B 38/10* (2013.01); *B32B 2037/243* (2013.01); *B32B 2309/02* (2013.01); *B32B 2309/04* (2013.01);
(Continued)

(58) Field of Classification Search
CPC ..... B32B 43/006; B32B 38/10; Y10T 156/11; Y10T 156/1168; Y10T 156/1179; Y10T 156/1195; Y10T 156/19; Y10T 156/1961; Y10T 156/1978; Y10T 156/1983;
(Continued)

(56) References Cited

U.S. PATENT DOCUMENTS 9,550,931 B2 * 1/2017 Yasuda .................. C09J 183/14
2007/0185310 A1  8/2007 Moore et al.
(Continued)

FOREIGN PATENT DOCUMENTS

JP  2013101870 A1 * 5/2013
KR  1020130000484 A1 * 1/2013

OTHER PUBLICATIONS

PCT/EP2011/055630.*
(Continued)

*Primary Examiner* — Mark A Osele
*Assistant Examiner* — Nikolas R Harm
(74) *Attorney, Agent, or Firm* — Hovey Williams LLP (57) ABSTRACT

A process is disclosed for using two polymeric bonding material layers to bond a device wafer and carrier wafer in a way that allows debonding to occur between the two layers under low-force conditions at room temperature. Optionally, a third layer is included at the interface between the two layers of polymeric bonding material to facilitate the debonding at this interface. This process can potentially improve bond line stability during backside processing of temporarily bonded wafers, simplify the preparation of bonded wafers by eliminating the need for specialized release layers, and reduce wafer cleaning time and chemical consumption after debonding.

24 Claims, 6 Drawing Sheets

(51) Int. Cl.
    *B32B 37/14*     (2006.01)
    *B32B 37/30*     (2006.01)
    *B32B 43/00*     (2006.01)
    *B32B 37/24*     (2006.01)

(52) U.S. Cl.
    CPC ....... *B32B 2309/12* (2013.01); *B32B 2457/14* (2013.01); *H01L 2221/6834* (2013.01); *H01L 2221/68318* (2013.01); *H01L 2221/68327* (2013.01); *H01L 2221/68381* (2013.01); *H01L 2221/68386* (2013.01); *Y10T 156/11* (2015.01); *Y10T 156/1168* (2015.01); *Y10T 156/1179* (2015.01); *Y10T 156/1195* (2015.01); *Y10T 156/19* (2015.01); *Y10T 156/1961* (2015.01); *Y10T 156/1978* (2015.01); *Y10T 156/1983* (2015.01); *Y10T 156/1994* (2015.01); *Y10T 428/1452* (2015.01); *Y10T 428/31645* (2015.04); *Y10T 428/31667* (2015.04); *Y10T 428/31692* (2015.04)

(58) Field of Classification Search
    CPC ............. Y10T 156/1994; Y10S 156/93; Y10S 156/941; H01L 2221/68381; H01L 2221/68386
    USPC ....... 156/701, 714, 716, 719, 750, 764, 765, 156/767
    See application file for complete search history.

(56) References Cited

U.S. PATENT DOCUMENTS

| | | |
|---|---|---|
| 2008/0173970 A1 | 7/2008 | Pillalamarri |
| 2009/0038750 A1 | 2/2009 | Hong et al. |
| 2009/0218560 A1 | 9/2009 | Flaim et al. |
| 2010/0051189 A1* | 3/2010 | Kawabata ............... H05K 3/007 156/247 |
| 2010/0112305 A1 | 5/2010 | Hong et al. |
| 2011/0308739 A1 | 12/2011 | McCutcheon et al. |
| 2012/0028438 A1* | 2/2012 | Richter ............... H01L 21/6835 438/458 |
| 2012/0034437 A1 | 2/2012 | Puligadda et al. |
| 2013/0029145 A1* | 1/2013 | Kato ..................... C09J 183/04 428/354 |
| 2013/0048224 A1* | 2/2013 | George ............. H01L 21/67282 156/752 |
| 2013/0084459 A1 | 4/2013 | Larson et al. |
| 2014/0020847 A1* | 1/2014 | Burggraf ........... H01L 21/67092 156/714 |
| 2014/0106137 A1* | 4/2014 | Kondo ................ H01L 21/6835 428/195.1 |
| 2014/0183728 A1* | 7/2014 | Han ........................ H01L 24/14 257/737 |
| 2015/0024574 A1* | 1/2015 | Kim ....................... C09J 183/04 438/458 |

OTHER PUBLICATIONS

John et al., "Low Cost, Room Temperature Debondable Spin-on Temporary Bonding Solution: A Key Enabler for 2.5D/3D IC Packaging," Proceedings of IEEE, 2013 Electronic Components & Technology Conference (ECTC), Las Vegas, NV, May 29, 2013, pp. 107-112.

Thin Wafer Laser Debonding—Fast and Without Fuss, Coherent, http://www.coherent.com/downloads/Whitepaper_Thin_WaferLaser_Debonding, 4 pages.

3M Wafer Support System Brochure, 2009, www.3M.com/wss, 4 pages.

Hermanowski, James, "Thin Wafer Handling—Study of Temporary Wafer Bonding Materials and Processes," SUSS MicroTec, Inc., Waterbury Center, VT, USA, 3DIC 2009 IEEE International Conference, 5 pages.

* cited by examiner

DUAL-LAYER BONDING MATERIAL PROCESS FOR TEMPORARY BONDING OF MICROELECTRONIC SUBSTRATES TO CARRIER SUBSTRATES

RELATED APPLICATIONS

This application claims the priority benefit of a provisional application entitled DUAL-LAYER BONDING MATERIAL PROCESS FOR TEMPORARY BONDING OF MICROELECTRONIC SUBSTRATES TO CARRIER SUBSTRATES, Ser. No. 61/871,158, filed Aug. 28, 2013, incorporated by reference herein.

BACKGROUND OF THE INVENTION

Field of the Invention

The present invention is broadly concerned with novel temporary wafer bonding methods utilizing dual layer bonding systems. The inventive methods can support a device wafer on a carrier substrate during wafer thinning and other backside processing.

Description of the Prior Art

Temporary wafer bonding (TWB) normally refers to a process for attaching a device wafer or microelectronic substrate to a carrier wafer or substrate by means of a polymeric bonding material. After bonding, the device wafer is thinned, typically to less than 50 μm, and then processed to create through-silicon vias (TSV), redistribution layers, bond pads, and other circuit features on its backside. The carrier wafer supports the fragile device wafer during the backside processing, which can entail repeated cycling between ambient and high temperatures (>250° C.), mechanical shocks from wafer handling and transfer steps, and strong mechanical forces, such as those imposed during wafer back-grinding processes used to thin the device wafer. When all of this processing has been completed, the device wafer is usually attached to a film frame and then separated, or debonded, from the carrier wafer and cleaned before further operations take place.

Most TWB processes use either one or two layers between the device wafer and the carrier wafer. In the case of a two-layer system, the first layer is a polymeric bonding material. The polymeric bonding material layer is typically 10-120 μm thick and, more commonly, about 50-100 μm thick. The second layer is comparatively thin, typically less than 2 μm, and is present to enable facile separation of the bonded wafer pair after processing. The second layer, which may or may not be polymeric in nature, usually functions in one of two ways. In the first instance, the second layer creates a non-bonding or weakly bonding interface with the device or carrier wafer surface. This allows the bonded wafer pair to be separated by applying low mechanical force to delaminate the structure at the weak interface. In the second instance, the thin layer responds to radiation from a laser or other light source, which leads to decomposition of the layer itself or decomposition of the adjacent polymeric bonding material, causing bonding integrity to be lost within the structure and allowing it to come apart without applying mechanical force.

Laser-induced release is becoming a popular mode of debonding, and materials are available for operating at laser wavelengths ranging from the ultraviolet (e.g., 248 nm and 308 nm) to the near infrared (e.g., 1064 nm). In some cases, the polymeric bonding material has sufficient response to the laser radiation that a separate, thin light-sensitive layer is not required. Polyimide bonding materials, for example, have very high optical density in the ultraviolet and will readily ablate when scanned with a 308-nm excimer laser at a dosage of about 250 mJ/cm$^2$.

In some processes, two or more polymeric bonding materials have been used to form the bond line in place of a single, polymeric bonding material. In one such process, a first rigid thermoplastic bonding layer that does not flow appreciably at normal wafer bonding and backside processing temperatures (200°-280° C.) can be applied to a device wafer to enhance its mechanical stability while the bonded structure is being processed. The device wafer coated with this first bonding material is then bonded to a carrier wafer that has been coated with a second bonding material, or, alternatively, the second bonding material is coated on top of the first bonding material, and the resulting structure is bonded to a carrier wafer. The second bonding material softens and flows during the bonding process and has the proper surface characteristics to form a strong, continuous adhesive bond with the first rigid bonding material, which is a requirement for the multiple layer bonded structures.

However, in prior art multi-layer structures such as these, the occurrence of strong bonding between the first and second bonding layers creates practical difficulties, especially for cleaning, since both layers will reside on the device wafer after the carrier has been separated from the structure. Because the first and second bonding materials are different compositions, it may be necessary to use a different cleaning solution for each material, and these solutions may not be compatible in the same wafer cleaning system. Furthermore, depending upon the bonding material, wet chemical removal of the two bonding layers may not even be possible. While one can resort to peeling to remove the bonding material, peeling processes (which are analogous to removing an adhesive tape from a surface) are generally viewed as undesirable since they impose large mechanical stresses on the device wafer and tend to leave behind residue. There is a need for new TWB methods that allow for easier separation of the bonded wafers without undue stress or strain on the device features.

SUMMARY OF THE INVENTION

The present invention overcomes the problems of the prior art by providing a novel temporary bonding article and method. The article comprises:

a first substrate having a back surface and a device surface;

a first bonding layer on the device surface and having an adhesion strength toward the device surface, the first bonding layer being formed of a continuous and consistent material along substantially all of the device surface;

a second substrate having a carrier surface; and a second bonding layer on the carrier surface and having an adhesion strength toward the carrier surface, the second bonding layer being formed of a continuous and consistent material along substantially all of the carrier surface.

The first and second substrates are bonded to one another through the first and second bonding layers. The first and second bonding layers have an adhesion strength toward one another that is lower than the first bonding layer adhesion strength toward the device surface, and lower than the second bonding adhesion strength toward the carrier surface.

The method is directed toward providing the above-described article and separating the first and second substrates.

DETAILED DESCRIPTION OF THE PREFERRED EMBODIMENTS

In more detail, the present invention provides methods of forming microelectronic structures using multilayer bonding schemes. While the drawings illustrate, and the specification describes, certain preferred embodiments of the invention, it is to be understood that such disclosure is by way of example only. Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. There is no intent to limit the principles of the present invention to the particular disclosed embodiments. For example, in the drawings, the size and relative sizes of layers and regions may be exaggerated for clarity. In addition, embodiments of the present invention should not be construed as limited to the particular shapes of regions illustrated herein but are to include deviations in shapes that result, for example, from manufacturing. For example, a region illustrated as a rectangle may have rounded or curved features. Thus, the regions illustrated in the figures are schematic in nature and their shapes are not intended to illustrate the precise shape of a region of a device or of topography and are not intended to limit the scope of the present invention.

Figure 1:
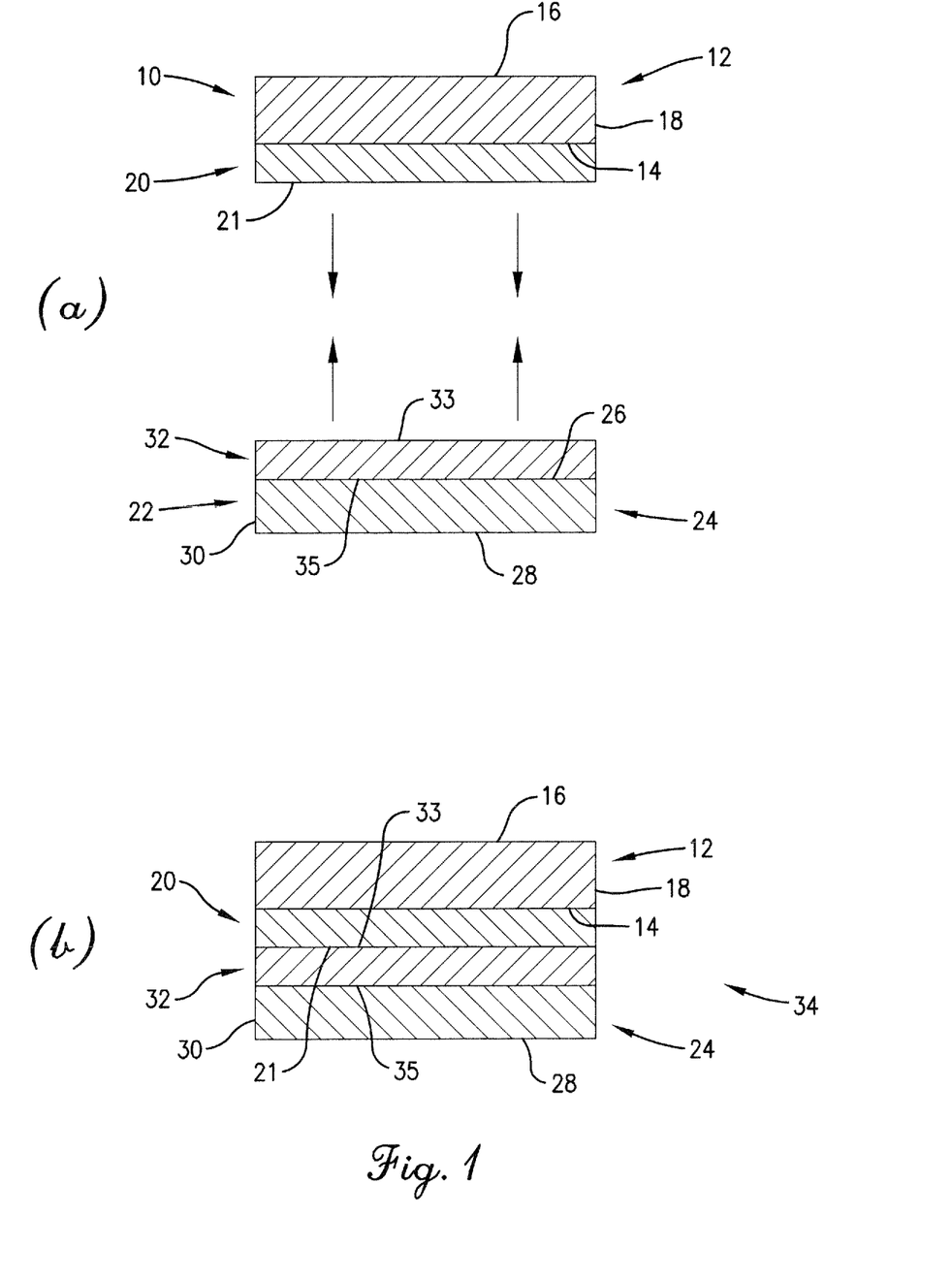
FIG. 1 is a cross-sectional view of a schematic drawing showing a preferred embodiment of the invention.

Referring to FIG. 1(a), a precursor structure 10 is depicted in a schematic and cross-sectional view. Structure 10 includes a first substrate 12. Substrate 12 has a front or device surface 14, a back surface 16, and an outermost edge 18. Although substrate 12 can be of any shape, it would typically be circular in shape. Preferred first substrates 12 include device wafers such as those whose device surfaces comprise arrays of devices (not shown) selected from the group consisting of integrated circuits, MEMS, microsensors, power semiconductors, light-emitting diodes, photonic circuits, interposers, embedded passive devices, and other microdevices fabricated on or from silicon and other semi-conducting materials such as silicon-germanium, gallium arsenide, and gallium nitride. The surfaces of these devices commonly comprise structures (again, not shown) formed from one or more of the following materials: silicon, polysilicon, silicon dioxide, silicon (oxy)nitride, metals (e.g., copper, aluminum, gold, tungsten, tantalum), low k dielectrics, polymer dielectrics, and various metal nitrides and silicides. The device surface 14 can also include at least one structure selected from the group consisting of: solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, and metal silicides.

A composition is applied to the first substrate 12 to form a first bonding layer 20 on the device surface 14, as shown in FIG. 1(a). Bonding layer 20 has an upper surface 21 remote from first substrate 12, and preferably, the first bonding layer 20 is formed directly on the device surface 14 (i.e., without any intermediate layers or surface treatments between the first bonding layer 20 and first substrate 12). Additionally, it is preferred that the first bonding layer 20 extend entirely across device surface 14 (to outermost edge 18), and that it be formed of the same composition entirely across the surface 14 (i.e., that it is a consistent and continuous composition throughout). The composition can be applied by any known application method, with one preferred method being spin-coating the composition at speeds of from about 500 rpm to about 5,000 rpm (preferably from about 500 rpm to about 2,000 rpm) for a time period of from about 5 seconds to about 120 seconds (preferably from about 30 seconds to about 90 seconds). Alternatively, the composition can be applied by other methods including laminating, spray coating, jetting, or screen printing.

After the composition is applied, it is preferably heated to a temperature of from about 80° C. to about 250° C., and more preferably from about 170° C. to about 220° C. and for time periods of from about 60 seconds to about 8 minutes (preferably from about 90 seconds to about 6 minutes). Depending upon the composition used to form the first bonding layer 20, baking can also initiate a crosslinking reaction to cure the layer 20. In some embodiments, it is preferable to subject the layer to a multi-stage bake process, depending upon the composition utilized. Also, in some instances, the above application and bake process can be repeated on a further aliquot of the composition, so that the first bonding layer 20 is "built" on the first substrate 12 in multiple steps.

A second precursor structure 22 is also depicted in a schematic and cross-sectional view in FIG. 1(a). Second precursor structure 22 includes a second substrate 24. In this embodiment, second substrate 24 is a carrier wafer. That is, second substrate 24 has a front or carrier surface 26, a back surface 28, and an outermost edge 30. Although second substrate 24 can be of any shape, it would typically be circular in shape and sized similarly to first substrate 12. Preferred second substrates 24 include silicon, sapphire, quartz, metals (e.g., aluminum, copper, steel), and various glasses and ceramics. Suitable carriers should have a similar coefficient of thermal expansion (CTE) to the device substrate.

A second composition is applied to the second substrate 24 to form a second bonding layer 32 on the carrier surface 26, as shown in FIG. 1(a). Second bonding layer 32 has an upper surface 33 remote from second substrate 24, and a lower surface 35 adjacent second substrate 24. Preferably, the second bonding layer 32 is formed directly on the carrier surface 26 (i.e., without any intermediate layers between the second bonding layer 32 and second substrate 24). Additionally, it is preferred that the second bonding layer 32 extend entirely across carrier surface 26 (to outermost edge 30), and that it be formed of the same composition entirely across the carrier surface 26 (i.e., that it is a consistent and continuous composition throughout). The composition can be applied by any known application method, with one preferred method being spin-coating the composition at speeds of from about 500 rpm to about 5,000 rpm (preferably from about 500 rpm to about 2,000 rpm) for a time period of from about 5 seconds to about 120 seconds (preferably from about 30 seconds to about 90 seconds). After the composition is applied, it is preferably heated to a temperature of from about 80° C. to about 250° C., and more preferably from about 170° C. to about 220° C. and for time periods of from about 60 seconds to about 8 minutes (preferably from about 90 seconds to about 6 minutes). In some embodiments, it is preferable to subject the layer to a multi-stage bake process, depending upon the composition utilized.

Figure 2:
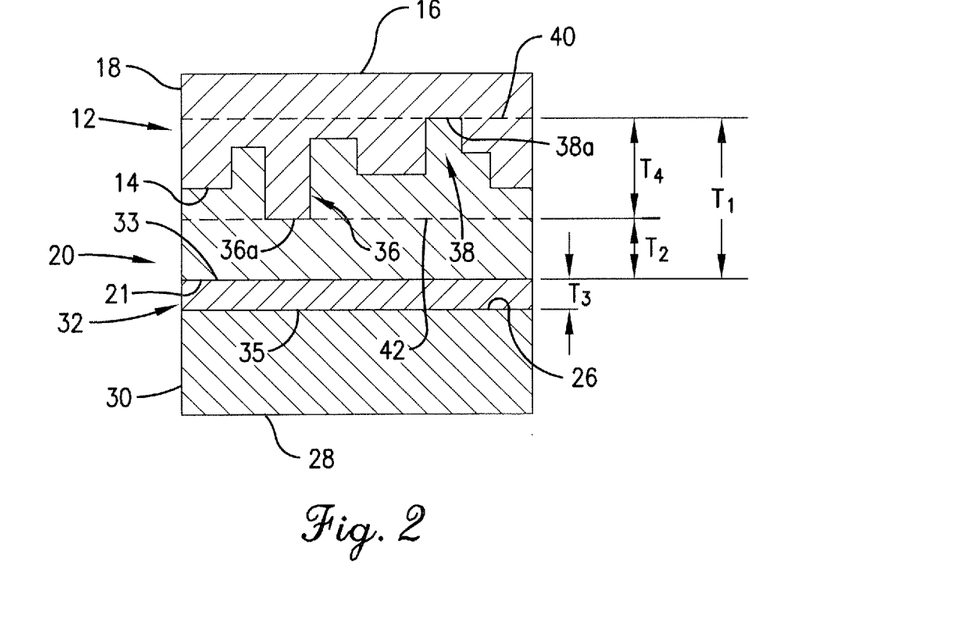
FIG. 2 is a cross-sectional view of a schematic drawing illustrating how thicknesses are determined.

The thickness of first and second bonding layers 20 and 32 (as well as other layers as described herein) can best be illustrated by reference to FIG. 2, where like numbering has been used to represent like parts. Device surface 14 has been drawn in FIG. 2 to schematically depict the variation in topography on device surface 14 due to the presence of the above-described devices as well as of raised features, contact holes, via holes, lines, trenches, etc., that are present on or in device surface 14. Among the various features found on device surface 14 are highest feature 36 and lowest feature 38. (As used herein, "highest" refers to the feature extending the farthest from back surface 16 of first substrate 12, while "lowest" refers to the feature whose lowest point is closest to back surface 16 of first substrate 12.) Highest feature 36 has an uppermost surface 36a, while lowest feature 38 has a lowermost surface or point 38a. When referring to the thickness of a layer that has been applied to a topographical (i.e., non-planar) surface, two thicknesses may be references. $T_1$ refers to the distance from a lower plane 40 defined by lowermost surface or point 38a and extending to upper surface 21, as exemplified in FIG. 2. $T_2$ refers to the layer's thickness as measured above the uppermost surface 36a. Specifically, and as shown in FIG. 2, this thickness $T_2$ begins at upper plane 42 and extends to the upper surface 21. When referring to the thickness of a layer that has been applied to a planar (or substantially planar) surface, that thickness is represented by $T_3$ in FIG. 2, and is the distance between lower surface 35 and upper surface 33 of layer 32. Finally, in some instances, thickness $T_4$ is used, and it refers to the distance from lower plane 40 to upper plane 42. All thicknesses refer to average thicknesses taken over five measurements.

In the embodiment of this invention, first bonding layer 20 preferably has a thickness $T_1$ that is at least equal to $T_4$, preferably from about $1.1T_4$ to about $1.5T_4$, and more preferably from about $1.2T_4$ to about $1.3T_4$. This will typically result in a thickness $T_1$ of at least about 24 µm, more preferably from about 45 µm to about 200 µm, and even more preferably from about 50 µm to about 150 µm. Furthermore, first bonding layer 20 preferably has a thickness $T_2$ of at least about 5 µm, more preferably from about 5 µm to about 50 µm, and even more preferably from about 10 µm to about 30 µm. Second bonding layer 32 has a thickness $T_3$ of from about 2 µm to about 50 µm, preferably from about 3 µm to about 30 µm, and more preferably from about 5 µm to about 25 µm.

The materials from which first and second bonding layers 20 and 32 are formed should be capable of forming strong adhesive bonds with the first and second substrates 12 and 24, respectively. Anything with an adhesion strength to the first and second substrates 12 and 24 of greater than about 50 psig, preferably from about 80 psig to about 250 psig, and more preferably from about 100 psig to about 150 psig as determined by ASTM D4541/D7234, would be desirable for use as first and second bonding layers 20 and 32. At the same time, the materials from which first and second bonding layers 20 and 32 are formed should not form strong adhesive bonds with one another. That is, the materials should be selected so that first and second bonding layers 20, 32 have an adhesion strength to one another of from about 1 psig to about 50 psig, preferably from about 1 psig to about 35 psig, and more preferably from about 1 psig to about 30 psig.

Advantageously, depending upon the compositions and/or processing utilized, this lower adhesion strength between the first and second bonding layers 20, 32 may be present upon bonding of substrates 12, 24, or that lower strength may not be present until somewhere later in the processing. For example, upon initial bonding of first and second bonding layers 20, 32, the adhesion strength between first and second bonding layers 20, 32, may be equal to or greater than the adhesion strength between first bonding layer 20 and the device surface 14, and between second bonding layer 32 and carrier surface 26. That bonding interface may then weaken during wafer processing so that it is weaker than that between the bonding layers and the respective substrate surfaces to which they are attached, thus facilitating separation at that interface.

The compositions for use in forming first and second bonding layers 20 and 32 can be selected from commercially available bonding compositions that would be capable of being formed into layers possessing the above properties. Typical such compositions are organic and will comprise a polymer or oligomer dissolved or dispersed in a solvent system. The polymer or oligomer is typically selected from the group consisting of polymers and oligomers of cyclic olefins (including copolymer forms), epoxies, acrylics, silicones, styrenics, vinyl halides, vinyl esters, polyamides, polyimides, polysulfones, polyethersulfones, polyolefins, polyisoprenes, polyurethanes, polyamide esters, polyimide esters, and polyacetals. Examples of preferred bonding compositions include those selected from the group consisting of poly(stryrene-co-acrylonitrile), polyvinyl butyral, polyvinylpyrrolidone, and poly(2-ethyl-2-oxazoline), and related polyalkyloxazolines.

Typical solvent systems will depend upon the polymer or oligomer selection, but may include organic or inorganic solvents, including water. Typical solids contents of the compositions will range from about 1% to about 60% by weight, and preferably from about 3% to about 40% by weight, based upon the total weight of the composition taken as 100% by weight.

In one embodiment, the bonding layers 20, 32 will have a softening point (ring and ball) that is less than about 220° C., preferably from about 50° C. to about 220° C., and more preferably from about 100° C. to about 150° C. Some suitable compositions are described in U.S. Patent Publication Nos. 2007/0185310, 2008/0173970, 2009/0038750, and 2010/0112305, each incorporated by reference herein.

In another embodiment, the first and second bonding layers 20 and 32 will be formed from compositions that are essentially free of silicones. That is, the materials (and thus the resulting bonding layers 20, 32) will comprise less than about 2% by weight silicone, preferably less than about 1% by weight silicone, more preferably less than about 0.5% by weight silicone, and even more preferably about 0% by weight silicone, based upon the total weight of the composition or final layer taken as 100% by weight.

In one embodiment, first and second bonding layers 20, 32 are selected so that one of the layers 20, 32 is thermosetting, while the other of layers 20, 32 is thermoplastic. Most preferably, bonding layer 32 will be the thermosetting layer. In this embodiment, the bonding layer can be a curable polymeric material that can be chemically crosslinked by heat, light, or other means. Such bonding materials could include photo- and thermally-curable resin- and polymer-containing compositions that, preferably, produce little or no volatile by-products when cured. These include resin and polymer compositions containing at least two reactive epoxy, acrylate, benzoxazine, maleimide, benzocyclobutene, or cyanate ester moieties. The reactive moieties can also include chalcone, stilbene, and other photodimerizable functional groups. Epoxy resin-containing compositions that are cured with the aid of a photoacid generator (PAG) or thermal acid generator (TAG) are especially useful for practicing this embodiment.

The process for applying and drying a curable composition to form a bonding layer prior to the bonding process should not cause the material to crosslink substantially so that it will remain flowable during the bonding process and allow a void-free bond line to be formed. The previously-described application processes are suitable here as well. After the composition is applied, it is preferably heated to a temperature of from about 60° C. to about 200° C., and more preferably from about 80° C. to about 150° C., and for time periods of from about 60 seconds to about 3 minutes (preferably from about 90 seconds to about 2 minutes). As previously described, it may be preferable to subject the layer to a multi-stage bake process, depending upon the composition utilized. The curable bonding layer 32 (or 20, as the case may by) has a softening point that is at least about 450° C., preferably from about 560° C. to about 200° C., and more preferably from about 680° C. to about 150° C. The thickness $T_3$ of a cured or crosslinked bonding layer 32 is preferably from about 5 µm to about 150 µm, more preferably from about 10 µm to about 100 µm and, most preferably from about 20 µm to about 60 µm.

Structures 10 and 22 are then pressed together in a face-to-face relationship, so that upper surface 21 of first bonding layer 20 is in contact with upper surface 33 of second bonding layer 32 (FIG. 1(b)). While pressing, sufficient pressure and heat are applied for a sufficient amount of time so as to effect bonding of the two structures 10 and 22 together to form bonded stack 34. The bonding parameters will vary depending upon the compositions from which bonding layers 20 and 32 are formed, but typical temperatures during this step will range from about 150° C. to about 375° C., and preferably from about 160° C. to about 350° C., with typical pressures ranging from about 1,000 N to about 5,000 N, and preferably from about 2,000 N to about 4,000 N, for a time period of from about 30 seconds to about 5 minutes, and more preferably from about 2 minutes to about 4 minutes.

In embodiments where one of the bonding layers 20, 32 is formed from a curable composition, the bonding process is conducted in a similar manner to that described above; however, the bonding pressure and temperature may be reduced to compensate for the high flow of the composition before it cures. Typical bonding temperatures will range from about 60° C. to about 200° C., and preferably from about 80° C. to about 150° C., with typical pressures ranging from about 500 N to about 5,000 N, and preferably from about 1000 N to about 3,000 N, for a time period of from about 30 seconds to about 5 minutes, and more preferably from about 1 minute to about 3 minutes. The curable bonding composition used to form the bonding layer may begin to cure during the bonding process depending upon the bonding temperature and time that is applied. A post-bond curing bake can be applied to complete the curing process of the bonding layer 20 or 32. The post-bond curing bake is typically conducted at 150° C. to about 250° C., and preferably from about 170° C. to 220° C. for about 30 seconds to about 5 minutes, and more preferably for about 1 minute to about 3 minutes.

Figure 3:
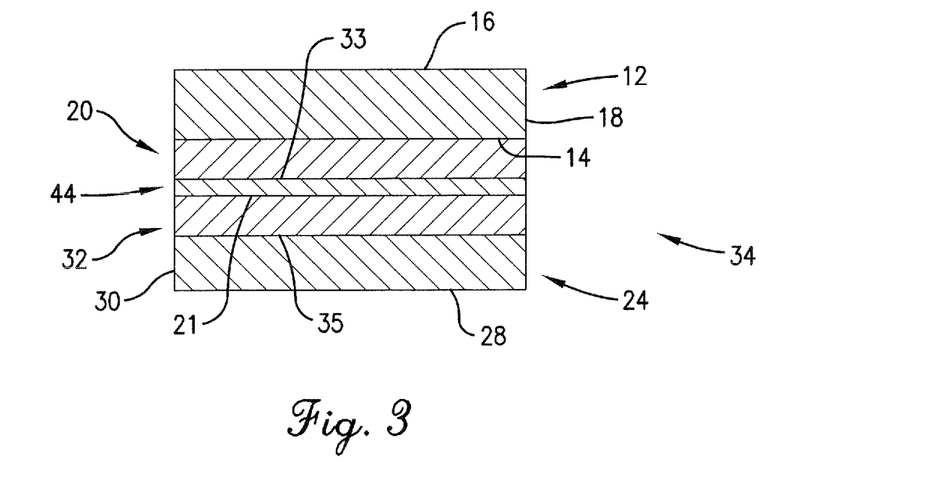
FIG. 3 is a cross-sectional view of a schematic drawing showing an alternate embodiment of the invention.

In another embodiment, a thin layer 44 can be included between first and second bonding layers 20, 32. A preferred thin layer 44 is a release layer, and this layer will typically have an average thickness of from about 0.05 µm to about 5 preferably from about 0.1 µm to about 2 µm, and more preferably from about 0.2 µm to about 1 µm. It will be appreciated that layer 44 can further facilitate mechanical delamination, thus the material from which layer 44 is formed should be selected so that it has an adhesion strength to first and second bonding layers 20, 32 of from about 1 psig to about 50 psig, preferably from about 1 psig to about 35 psig, and more preferably from about 1 psig to about 30 psig. Preferred layers 44 are formed from a composition comprising a polymer or monomer dissolved or dispersed in a solvent system, with preferred polymers and monomers being selected from the group consisting of fluoropolymers and other polymers that exhibit high contact angles (at least about 80°, preferably at least about 85°, and even more preferably at least about 90°) with water. Preferred solvent systems are selected from the group consisting of ketones, alcohols, glycol ethers, and esters. It is preferred that the bonding layer 12 extend entirely across and between first and second bonding layers 20, 32 (i.e., to outermost edge 18), and that it be formed of the same composition entirely across the bonding layers 20, 32 (i.e., that it is a consistent and continuous composition throughout).

At this stage, the first substrate 12 can be safely handled and subjected to further processes that might otherwise have damaged first substrate 12 without being bonded to second substrate 24. Thus, the structure can safely be subjected to backside processing such as back-grinding, CMP, etching, metal and dielectric deposition, patterning (e.g., photolithography, via etching), passivation, annealing, and combinations thereof, without separation of substrates 12 and 24 occurring, and without infiltration of any chemistries encountered during these subsequent processing steps. Not only can first bonding layer 20 and second bonding layer 32 survive these processes, they can also survive processing temperatures up to about 450° C., preferably from about 200° C. to about 400° C., and more preferably from about 200° C. to about 350° C.

Once processing is complete, the substrates 12, 24 can be separated by any number of separation methods (not shown). One method involves applying a force to at least one of the substrates 12, 24, thereby separating them. Preferably, this force results in at least one of substrates 12 and 24 bending at an angle away from the stack forming precursor structure 10, so as to separate the substrates 12 and 24 with a peeling motion. This is described in more detail in U.S. Patent Publication No. 2011/0308739, incorporated by reference herein, which also shows preferred equipment for carrying out this separation process.

It will be appreciated that because the first and second bonding layers 20, 32 bond strongly to their respective substrate surfaces 14, 26 but do not bond strongly to one another at this stage (even if they bonded more strongly prior to processing), this separation will result in the breaking of the interface between first and second bonding layers 20, 32, or at thin layer 44, using low-force mechanical delamination.

Alternative separation methods involve selective treatments to reduce the force needed for mechanical delamination. That is, the bonding strength between first and second bonding layers 20 and 32, or between either of these layers 20, 32 and thin layer 44 that resides between them, can be decreased in a controllable way so that mechanical delamination can be performed easily after the treatment is applied, but not before. Such treatments include dissolving one or both of the first and second bonding layers 20, 32 in a solvent (e.g., limonene, dodecene, propylene glycol monomethyl ether (PGME)). Alternatively, substrates 12 and 24 can also be separated by first mechanically disrupting or destroying the periphery of one or both of first and second bonding layers 20, 32 and/or thin layer 44 using laser ablation, plasma etching, water jetting, or other high energy techniques that effectively etch or decompose first and second bonding layers 20, 32. In one preferred method, exposure with a light source such as a laser or ultraviolet lamp is utilized. In another, a chemical change is induced in one or more of the first and second bonding layers 20, 32 and/or thin layer 44, which causes their mutual adhesion to decrease. It is also suitable to first saw or cut through the first and second bonding layers 20, 32 and/or thin layer 44, or to cleave the layers 20, 32 and/or thin layer 44 by some equivalent means.

Regardless of the embodiment, the substrates 12 and 24 are advantageously separated at the interface between first and second bonding layers 20, 32 or at thin layer 44. Further, the separation process leaves only first bonding layer 20 on the device surface 14 of first substrate 12. Hence, the cleaning process can be simplified and cleaning time can be shortened because the entire bond line thickness (i.e., first bonding layer 20, plus second bonding layer 32, plus thin layer 44, if present) does not have to be removed as is the case with the prior art, where the bonding layers themselves are strongly bonded together. Rather, the first bonding layer 20 can be removed from device surface 14 with a solvent capable of dissolving that layer. Moreover, the ability to separate first and second bonding layers 20 and 32 means that second bonding layer 32 can be a crosslinked polymeric composition since it will not have to be cleaned from the device surface 14 after separation.

In some embodiments, first bonding layer 20 will be selected so that it is suitable to leave some or all of it on the first substrate 12 permanently. In these instances, first bonding layer 20 will serve some function (e.g., gap fill) in subsequent wafer processing steps. Similarly, second bonding layer 32 may be removed from the second (i.e., carrier in this instance) substrate 24 with a solvent capable of dissolving the particular material, thus enabling carrier substrate reuse.

It will be appreciated that the present invention provides a number of additional advantages. For example, the bonding temperatures and overall thermal stability of the structure can be controlled due to the inventive methods. Thus, the inventive method allows the use of higher processing temperatures while simultaneously making bonding and debonding possible at lower temperatures.

EXAMPLES

The following examples set forth preferred methods in accordance with the invention. It is to be understood, however, that these examples are provided by way of illustration and nothing therein should be taken as a limitation upon the overall scope of the invention.

Example 1

Bonding Between Two Thermoplastic Bonding Materials

A cyclic olefin copolymer-based bonding composition A (available from Brewer Science, Inc., Rolla, Mo.) was coated to a thickness of approximately 50 μm onto the surface of wafer 1 by spin coating on a Cee® 200CB spin coater-bake plate combination tool at 1,000 rpm with a ramp of 3,000 rpm/s for 30 seconds. Wafer 1 was baked on a hotplate at 60° C. for 5 minutes, 100° C. for 5 minutes, and 180° C. for 4 minutes.

Figure 4:
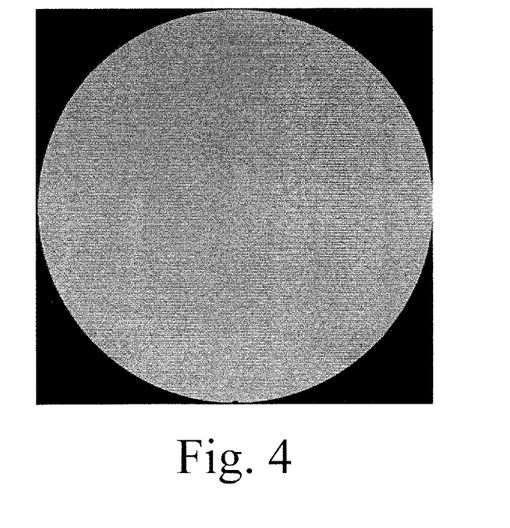
FIG. 4 is a scanning acoustic microscope ("SAM") photograph showing the Example 1 wafers after bonding.
Figure 5:
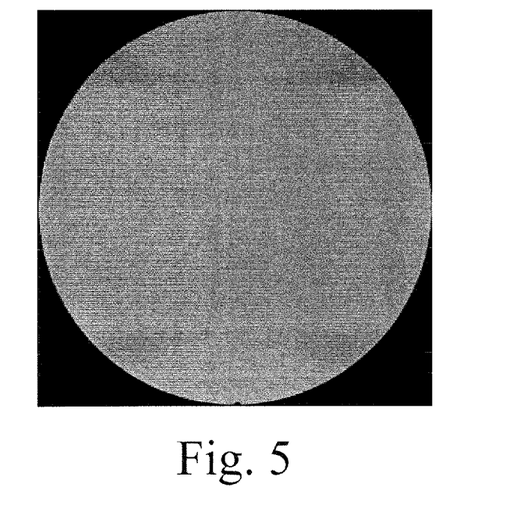
FIG. 5 is a SAM photograph showing the bonded Example 1 wafers after heat treatment.

A styrene-acrylonitrile copolymer-based bonding composition B (available from Brewer Science, Inc., Rolla, Mo.) was coated to a thickness of approximately 50 μm onto the surface of wafer 2 by spin coating on a Cee® 200CB tool at 1,000 rpm with a ramp of 200 rpm/s for 45 seconds. Wafer 2 was baked on a hotplate at 100° C. for 5 minutes and 180° C. for 5 minutes. The coated wafers were bonded face-to-face to one another in a vacuum chamber at <5 mbar with 1,800 N of compressive force at 220° C. for 3 minutes in an EVG510 thermocompression bonder (available from EV Group, St. Florian, Austria). After bonding, they were checked for voids between the two bonding compositions using a SAM made by Sonix™, Inc. (Springfield, Va.) as shown in FIG. 4. The bonded pair of wafers was heat-treated at 250° C. for 1 hour. They were checked for voids again using SAM imaging as shown in FIG. 5. The wafers were then debonded using a Brewer Science® ZoneBOND® separator. The wafers separated cleanly between the two bonding compositions. Either wafer in this Example could be considered the device wafer or the carrier wafer.

Example 2

Figure 6:
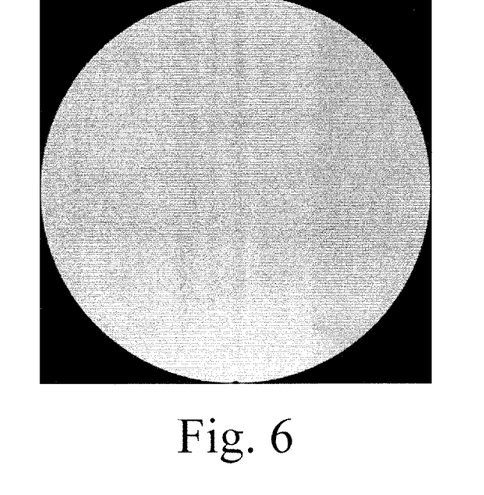
FIG. 6 is a SAM photograph showing the Example 2 wafers after bonding.
Figure 7:
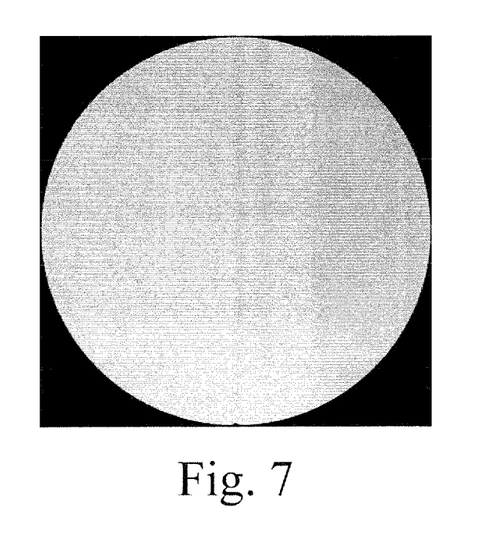
FIG. 7 is a SAM photograph showing the bonded Example 2 wafers after heat treatment.

Bonding Between Thermoplastic Bonding Material and Water-Soluble Bonding Material The cyclic olefin copolymer-based bonding composition A utilized in Example 1 was coated to a thickness of approximately 50 μm onto the surface of wafer 1 by spin coating on a Cee® 200CB spin coater-bake plate combination tool at 1,000 rpm with a ramp of 3,000 rpm/s for 30 seconds. Wafer 1 was baked on a hotplate at 60° C. for 5 minutes, 100° C. for 5 minutes, and 180° C. for 4 minutes. A water-soluble thermoplastic polymer of poly(2-ethyl-2-oxazoline) from Polymer Chemistry Innovations, Inc. in Tucson, Ariz. was coated to a thickness of approximately 50 μm onto the surface of wafer 2 by spin coating on a Cee® 200CB spin coater-bake plate combination tool at 1,000 rpm with a ramp of 3,000 rpm/s for 30 seconds. Wafer 2 was baked on a hotplate at 60° C. for 4 minutes, 100° C. for 4 minutes, and 180° C. for 4 minutes. The coated wafers were bonded face-to-face to one another in a vacuum chamber at <5 mbar with 1,800 N of compressive force at 220° C. for 3 minutes in an EVG510 bonder. After bonding, they were checked for voids between the two bonding compositions using a SAM (see FIG. 6). The bonded pair of wafers was heat-treated at 250° C. for 1 hour. They were checked for voids again using SAM imaging, as shown in FIG. 7.

The wafers were then debonded using a Brewer Science® ZoneBOND® separator. The wafers separated cleanly between the two bonding compositions. Either wafer in this Example could be considered the device wafer or the carrier wafer.

Example 3

Bonding Between Thermoplastic Bonding Material and Thermoset Bonding Material

Figure 8:
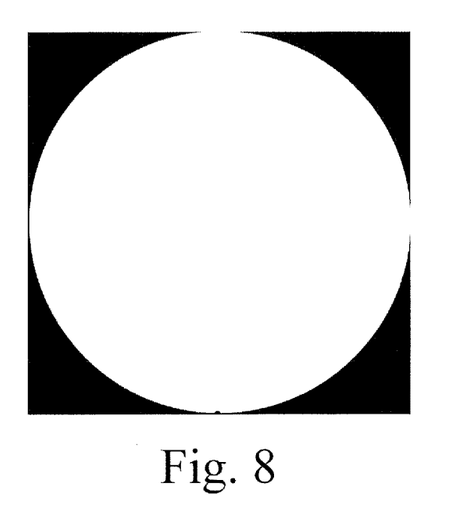
FIG. 8 is a SAM photograph showing the Example 3 wafers after bonding.
Figure 9:
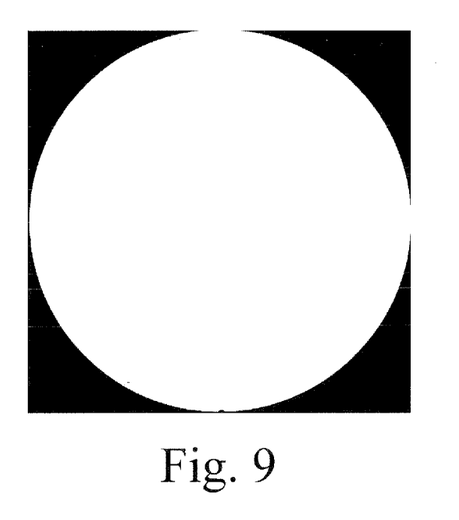
FIG. 9 is a SAM photograph showing the bonded Example 3 wafers after heat treatment.

The cyclic olefin copolymer-based bonding composition A utilized in Example 1 was spin coated to a thickness of approximately 50 μm onto the surface of wafer 1 by spin coating on a Cee® 200CB spin coater-bake plate combination tool at 1,000 rpm with a ramp of 3,000 rpm/s for 30 seconds. Wafer 1 was baked on a hotplate at 60° C. for 5 minutes, 100° C. for 5 minutes, and 180° C. for 4 minutes. An epoxy based photoresist material (SU-8® 2025, available from MicroChem, Westborough, Mass.) was applied to wafer 2 as bonding composition B. The SU-8 material was spin coated to a thickness of approximately 50 μm onto the surface of wafer 2 by spin coating on a Cee® 200CB spin coater-bake plate combination tool at 1,500 rpm with a ramp of 3,000 rpm/s for 30 seconds, after which the wafer was baked at 110° C. for 2 minutes. The coated wafers were bonded face-to-face to one another in a vacuum chamber at <5 mbar with 1,800 N of compressive force at 140° C. for 3 minutes using an EVG510 bonder. After bonding, they were checked for voids between the two bonding compositions using a SAM. The SAM image, after bonding, is shown in FIG. 8. The bonded pair of wafers was heat-treated at 260° C. for 30 minutes. During the heat treatment the SU-8 material fully cross-linked. They were checked for voids again using SAM imaging, as shown in FIG. 9.

The wafers were then debonded using a Brewer Science® ZoneBOND® separator. The wafers separated cleanly between cyclic olefin copolymer-based bonding composition A and the SU-8 material. As with the previous Examples, either wafer in this Example could be considered the device wafer or the carrier wafer.

Example 4

Bonding Between a High-Temperature Thermoplastic Bonding Material and

Moderate-Temperature Thermoplastic Bonding Material

Figure 10:
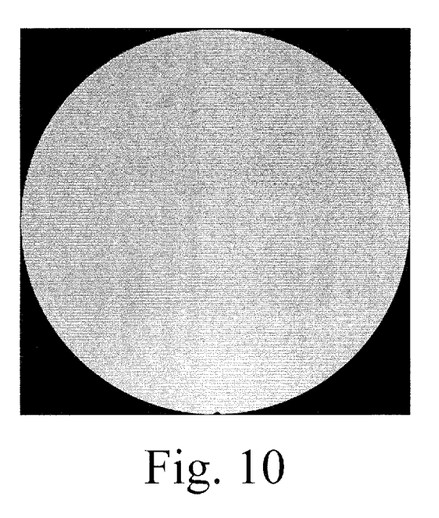
FIG. 10 is a SAM photograph showing the Example 4 wafers after bonding.
Figure 11:
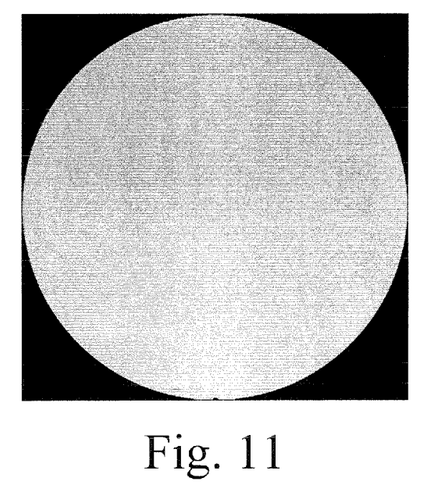
FIG. 11 is a SAM photograph showing the bonded Example 4 wafers after heat treatment.

The cyclic olefin copolymer-based bonding composition A of Example 1 was coated to a thickness of approximately 50 μm onto the surface of wafer 1 by spin coating on a Cee® 200CB spin coater-bake plate combination tool at 1,000 rpm with a ramp of 3,000 rpm/s for 30 seconds. Wafer 1 was baked on a hotplate at 60° C. for 5 minutes, 100° C. for 5 minutes, and 180° C. for 4 minutes. Udel® 3700 polysulfone (available from Solvay Corporation, Brussels, BE) was applied to wafer 2 as bonding composition B. It was dissolved in cyclopentanone a approximately 15% solids and spin coated to a thickness of approximately 3 pm onto the surface of wafer 2 by spin coating on a Cee® 200CB spin coater-bake plate combination tool at 1,000 rpm with a ramp of 3,000 rpm/s for 30 seconds. Wafer 2 was baked on a hotplate at 60° C. for 2 minutes, 100° C. for 2 minutes, and 180° C. for 1 minute. The coated wafers were bonded face-to-face to one another in a vacuum chamber at <5 mbar with 1,800 N of compressive force at 220° C. for 3 minutes in an EVG510 bonder. After bonding, they were checked for voids between the two bonding compositions using a SAM, as shown in FIG. 10. The bonded pair of wafers was heat treated at 250° C. for 1 hour. They were checked for voids again using SAM imaging, shown in FIG. 11.

The wafers were then debonded using a Brewer Science® ZoneBOND® separator. The wafers separated cleanly between cyclic olefin copolymer-based bonding composition A and the polysulfone bonding composition B. Either wafer in this example could be considered the device wafer or the carrier wafer.

We claim:

1. A temporary bonding method comprising:
providing a stack comprising:
  a first substrate having a back surface and a device surface;
  a first bonding layer on said device surface and having an adhesion strength toward said device surface, said first bonding layer being formed of the same composition across said device surface;
  a second substrate having a carrier surface; and
  a second bonding layer on said carrier surface and having an adhesion strength toward said carrier surface, said second bonding layer being formed of the same composition across said carrier surface, wherein:
    said first and second substrates are bonded to one another through said first and second bonding layers; and
    said first and second bonding layers have an adhesion strength toward one another that is lower than said first bonding layer adhesion strength toward said device surface and lower than said second bonding adhesion strength toward said carrier surface;
  wherein said first and second bonding layers are each substantially free of silicones and have an adhesion strength toward one another of from about 1 psig to about 50 psig; and
separating said first and second substrates.

2. The method of claim 1, said first and second bonding layers being in contact with one another so as to form a bonding interface there between, wherein said separating results in the separation of said first and second substrates at said bonding interface.

3. The method of claim 1, wherein said separating comprises applying a force to at least one of said first and second substrates, thereby separating said first substrate and second substrates.

4. The method of claim 3, wherein said force is applied at a portion of the periphery of at least one of said first and second substrates, causing said one of said first and second substrates to bend at an angle away from the stack, so as to separate said first and second substrates with a peeling motion.

5. The method of claim 2, wherein said separating comprises applying a force to at least one of said first and second substrates, thereby separating said first substrate and second substrates.

6. The method of claim 5, wherein said force is applied at a portion of the periphery of at least one of said first and second substrates, causing said one of said first and second substrates to bend at an angle away from the stack, so as to separate said first and second substrates with a peeling motion.

7. The method of claim 1, wherein said first bonding layer is formed directly on said device surface.

8. The method of claim 1, wherein said second bonding layer is formed directly on said carrier surface.

9. The method of claim 1, wherein said first bonding layer is formed directly on said device surface and said second bonding layer is formed directly on said carrier surface.

10. The method of claim 1, further comprising a release layer between said first and second bonding layers.

11. The method of claim 10, wherein said release layer has a thickness of from about 0.05 µm to about 5 µm.

12. The method of claim 10, wherein said separating occurs at said release layer.

13. The method of claim 10, wherein said release layer is formed of the same composition along substantially all of said first and second bonding layers.

14. The method of claim 1, wherein one of said first and second bonding layers is a thermosetting layer, and the other of said first and second bonding layers is a thermoplastic layer.

15. The method of claim 1, wherein each of said first and second bonding layers is individually formed from a composition comprising a polymer or oligomer dissolved or dispersed in a solvent system, said polymer or oligomer being selected from the group consisting of polymers and oligomers of cyclic olefins, epoxies, acrylics, silicones, styrenics, vinyl halides, vinyl esters, polyamides, polyimides, polysulfones, polyethersulfones, polyolefins, polyurethanes, polyamide esters, polyimide esters, and polyacetals.

16. The method of claim 1, wherein said device surface comprises an array of devices selected from the group consisting of integrated circuits; MEMS; microsensors; power semiconductors; light-emitting diodes; photonic circuits; interposers; embedded passive devices; and microdevices fabricated on or from silicon, silicon-germanium, gallium arsenide, and gallium nitride.

17. The method of claim 1, wherein said second substrate comprises a material selected from the group consisting of silicon, sapphire, quartz, metal, glass, and ceramics.

18. The method of claim 1, said device surface comprising at least one structure selected from the group consisting of: solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, and metal silicides.

19. The method of claim 1, wherein said providing comprises bonding said first and second substrates to one another to form said stack and subjecting said stack to processing, wherein said first and second bonding layers are bonded more strongly to one another prior to said processing than after said processing.

20. The method of claim 19, wherein said processing is selected from the group consisting of back-grinding, chemical-mechanical polishing, etching, metal and dielectric deposition, patterning, passivation, annealing, and combinations thereof.

21. The method of claim 1, wherein said providing comprises bonding said first and second substrates to one another to form said stack; the method further comprising subjecting said stack to processing after said providing and prior to said separating.

22. The method of claim 21, wherein said processing selected is from the group consisting of back-grinding, chemical-mechanical polishing, etching, metal and dielectric deposition, patterning, passivation, annealing, and combinations thereof.

23. The method of claim 1, said first and second bonding layer having an adhesion strength toward one another of from about 1 psig to about 35 psig.

24. A temporary bonding method comprising:
   providing a stack comprising:
      a first substrate having a back surface and a device surface;
      a first bonding layer on said device surface and having an adhesion strength toward said device surface, said first bonding layer being formed of the same composition across said device surface;
      a second substrate having a carrier surface; and
      a second bonding layer on said carrier surface and having an adhesion strength toward said carrier surface, said second bonding layer being formed of the same composition across said carrier surface, wherein:
         said first and second substrates are bonded to one another through said first and second bonding layers; and
         said first and second bonding layers have an adhesion strength toward one another that is lower than said first bonding layer adhesion strength toward said device surface and lower than said second bonding adhesion strength toward said carrier surface;
      wherein said first and second bonding layers are each substantially free of silicones and are in contact with one another so as to form a bonding interface there between; and
   separating said first and second substrates, wherein said separating results in the separation of said first and second substrates at said bonding interface.

* * * * *